United States Patent
Wang et al.

(10) Patent No.: US 7,994,559 B2
(45) Date of Patent: Aug. 9, 2011

(54) RECESSED-GATE TRANSISTOR DEVICE HAVING A DIELECTRIC LAYER WITH MULTI THICKNESSES AND METHOD OF MAKING THE SAME

(75) Inventors: Jer-Chyi Wang, Taoyuan County (TW); Tieh-Chiang Wu, I-Lan Hsien (TW); Chung-Yuan Lee, Tao-Yuan (TW); Jeng-Ping Lin, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 351 days.

(21) Appl. No.: 12/167,231

(22) Filed: Jul. 2, 2008

(65) Prior Publication Data

US 2009/0114968 A1    May 7, 2009

(30) Foreign Application Priority Data

Nov. 6, 2007   (TW) ................................ 96141856 A
May 12, 2008   (TW) ................................ 97117451 A

(51) Int. Cl.
   *H01L 21/82* (2006.01)
(52) U.S. Cl. ........................................ 257/302; 430/239

(58) Field of Classification Search .......... 257/296–313, 257/E27.084; 438/239
See application file for complete search history.

(56) References Cited

U.S. PATENT DOCUMENTS

| 5,640,034 | A  | * | 6/1997  | Malhi ............................ 257/341 |
| 6,815,307 | B1 | * | 11/2004 | Hsu et al. ...................... 438/386 |
| 6,872,629 | B2 |   | 3/2005  | Hsiao |
| 2002/0094622 | A1 | * | 7/2002 | Sneelal et al. ................ 438/197 |
| 2007/0246755 | A1 |   | 10/2007 | Lee |
| 2010/0264478 | A1 | * | 10/2010 | Rossi et al. ................... 257/302 |

* cited by examiner

*Primary Examiner* — Michael Lebentritt
*Assistant Examiner* — Karen Kusumakar
(74) *Attorney, Agent, or Firm* — Winston Hsu; Scott Margo

(57) ABSTRACT

A recessed-gate transistor device includes a gate electrode embedded in a gate trench formed in a semiconductor substrate, wherein the gate trench includes a vertical sidewall and a U-shaped bottom. A source region is provided at one side of the gate trench within the semiconductor substrate. A drain region is provided at the other side thereof. An asymmetric gate dielectric layer is formed between the gate electrode and the semiconductor substrate. The asymmetric gate dielectric layer has a first thickness between the gate electrode and the drain region and a second thickness between the gate electrode and the source region, wherein the first thickness is thicker than the second thickness.

10 Claims, 11 Drawing Sheets

RECESSED-GATE TRANSISTOR DEVICE HAVING A DIELECTRIC LAYER WITH MULTI THICKNESSES AND METHOD OF MAKING THE SAME

BACKGROUND OF THE INVENTION

1. Field of the Invention

The present invention relates to structures of a semiconductor device, and methods of making the same, and more particularly, to a recessed-gate transistor device having a dielectric layer with multi thicknesses.

2. Description of the Prior Art

As the size of semiconductor devices shrinks, the gate channel length decreases correspondingly. Consequently, a short channel effect may occur, resulting in problems in increasing the integration of the semiconductor devices and the operating performance.

The conventional method of solving the short channel effect includes decreasing the thickness of the gate oxide layer or increasing concentration of the dopants. These methods, however, may deteriorate the reliability of the devices and decrease the speed of transferring data.

To solve the above-mentioned problems, a recessed-gate transistor design or an extended U-shape device (EUD) is used in the semiconductor field to increase the integration of an IC, such as a DRAM, and elevate the operating performance.

The recessed-gate transistor has a gate insulation layer formed on sidewalls and the bottom surface of a recess etched into a substrate, where a conductive substance fills the recess, contrary to a planar gate type transistor having a gate electrode formed on a planar surface of a substrate. Therefore, the integration of the recessed-gate transistor can be increased.

FIG. 1 shows the sectional view of a prior art DRAM device. As shown in FIG. 1, a recessed-gate transistor device 110 and a deep trench capacitor 120 disposed adjacent to the recessed-gate transistor 110 constitute a DRAM cell. In FIG. 1, a deep trench capacitor 220, which is adjacent to the aforementioned DRAM cell and is a part of another DRAM cell, is also demonstrated.

The recessed-gate transistor device 110 includes a recessed gate 111, a source region 113, a drain region 114 and a gate dielectric layer 115. The recessed gate 111 is embedded in a gate trench 112 in the substrate 1100. The U-shaped channel 116 of the recessed-gate transistor device 110 is situated at the bottom of the gate trench 112. In addition, a bit line contact plug 140 is positioned on the source region 113.

The deep trench capacitor 120 includes a doped polysilicon 122 acting as a top electrode, a single-sided buried strap (SSBS) 126, a sidewall capacitor dielectric layer 123, a collar oxide layer 125 and a trench top oxide (TTO) 130. For the sake of simplicity, only the upper portions of the deep trench capacitor 120 are shown in the figures. It is understood that the deep trench capacitor 120 further comprises a buried plate acting as the bottom capacitor electrode, which is not shown.

The recessed-gate transistor device 110 is connected to a diffusion region 124 expanded from the SSBS 126 through the drain region 114.

The structures of the deep trench capacitors 120, 220 are substantially the same. The deep trench capacitor 120 and the deep trench capacitor 220 belong to different DRAM cells. In the same way, the deep trench capacitor 220 also includes a doped polysilicon 222, a single-sided buried strap (SSBS) 226, a sidewall capacitor dielectric layer 223, a collar oxide layer 225 and a trench top oxide (TTO) 230.

The aforementioned recessed-gate technology has some shortcomings, for, example, high capacitance forming between the gate and the drain region, or between the gate and the source region, and high gate induced drain leakage (GIDL) forming in a region indicated by a circle 150. Additionally, as the device is scaled down, the landing area, shown by $A_1$, will be too small and lead to the fabricating problems. These problems may deteriorate the operating performance of the devices.

SUMMARY OF THE INVENTION

It is one object of this invention to provide a recessed-gate MOS transistor with a gate dielectric layer with multi thicknesses so as to solve the problem of current leakage and improve the operating performance. Besides, the landing area can be increased.

According to the claimed invention, a recessed-gate transistor device comprises a substrate having a gate, wherein the gate has a buried portion embedded in the substrate and a dielectric layer with a multi thicknesses formed on an inner surface of the buried portion of the gate and a source region and a drain region, formed in the substrate and positioned in two opposite sides of the buried portion of the gate respectively.

According to another claimed invention, a memory device comprises a first deep trench capacitor and a second deep trench capacitor formed in a substrate, a gate partially embedded in the substrate and between the two deep trench capacitors, wherein the gate has a dielectric layer with a multi thicknesses formed in a bottom portion of the gate and a source region formed in the substrate and between the first deep trench capacitor and the gate, wherein the drain region has a first width and the source region has a second width, and the second width is longer than the first width.

According to another preferred embodiment of the claim invention, a method of forming an dielectric layer with multi thicknesses on a surface of a trench in a semiconductor substrate comprises: first, an ion implantation process is performed to a sidewall of the trench partially. Next, a thermal process is performed such that the first dielectric layer with a multi thicknesses is formed on the surface of the trench.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
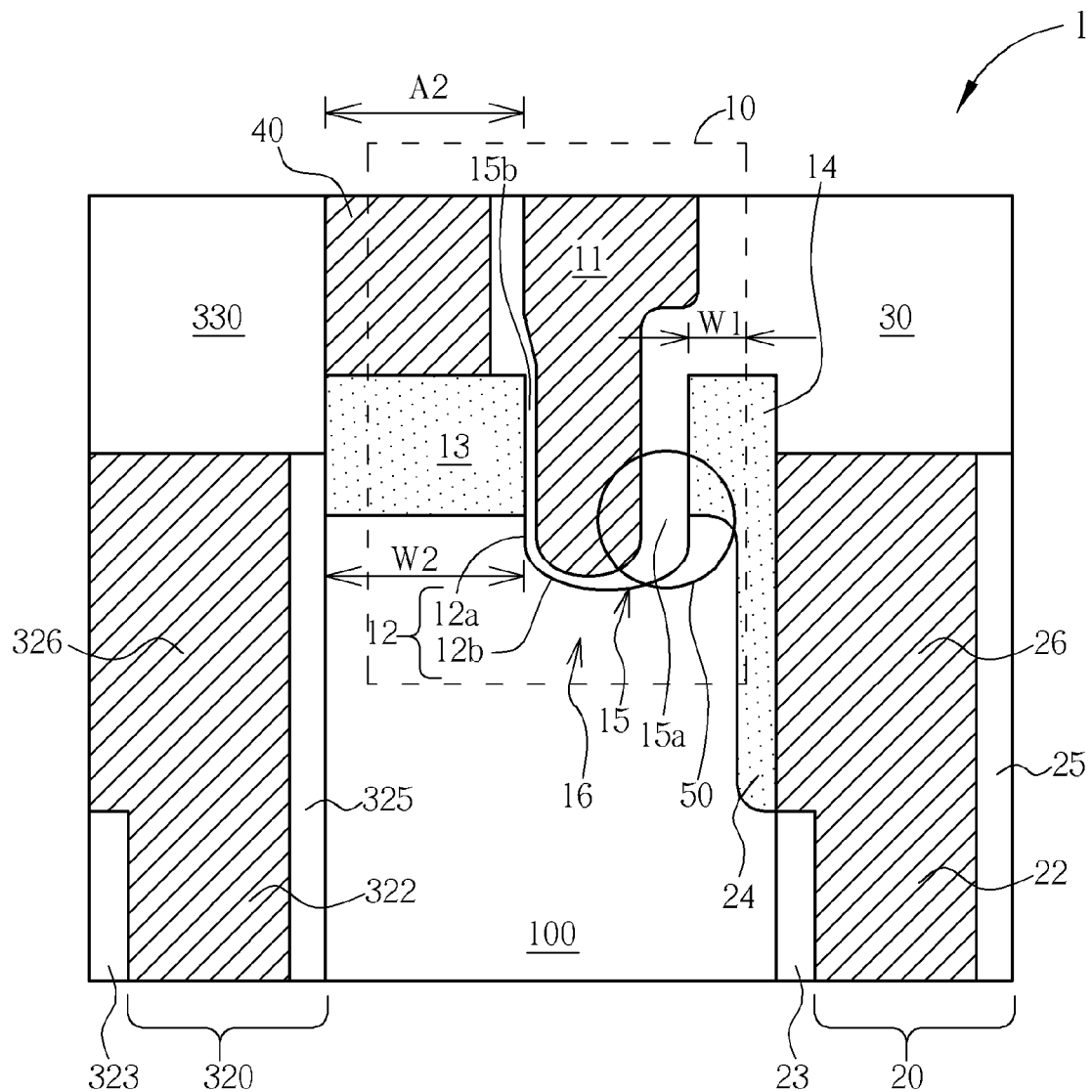
FIG. 2 is a schematic sectional view showing the recessed-gate MOS transistor device according to this invention.

FIG. 2 is a schematic sectional view showing the recessed-gate MOS transistor device according to this invention. As shown in FIG. 2, a recessed-gate MOS transistor device 10 is positioned in a deep trench capacitor DRAM array 1. Such device 10 is also called a recess channel array transistor device (RCAT). The recessed-gate MOS transistor device 10 and a deep trench capacitor structure 20 that is adjacent to the recessed-gate MOS transistor device 10 constitute a DRAM cell. Besides, another deep trench capacitor 320, which is adjacent to the recessed-gate MOS transistor device 10 and belong to another DRAM cell, is also demonstrated.

According to a preferred embodiment of the present invention, the recessed-gate MOS transistor device 10 includes a recessed gate electrode 11, a source region 13, a drain region 14, and a gate dielectric layer 15. The source region 13 has a second width $W_2$ and the drain region 14 has a first width $W_1$. The recessed gate electrode 11 is embedded in a gate trench 12 formed in a semiconductor substrate 100 with a predetermined depth.

The material of the recessed gate electrode 11 may be polysilicon, metal or a combination thereof. The gate trench 12 includes a sidewall 12a and a U-shaped bottom 12b. The U-shaped channel 16 of the recessed-gate MOS transistor device 10 is located at the U-shaped bottom 12b.

The gate dielectric layer 15 formed on an inner surface of the gate trench 12 may be formed by a furnace treatment, a rapid thermal process (RTP) or any method that can form oxide layers, but the in-situ steam generation (ISSG) process is not included.

According to a preferred embodiment of the present invention, the deep trench capacitor 20 comprises a doped polysilicon 22, a sidewall capacitor dielectric layer 23, such as an ONO dielectric layer, a collar oxide layer 25, a SSBS 26 and a trench top oxide (TTO) 30. The doped polysilicon 22 functions as a top electrode of the deep trench capacitor 20. For the sake of simplicity, only the upper portions of the deep trench capacitor 20 are shown in the figures. It is understood that the deep trench capacitor 20 further comprises a buried plate acting as the bottom capacitor electrode, which is not shown.

In addition, the single-sided buried strap (SSBS) 26 and the trench top oxide (TTO) 30 which are formed by the SSBS process are positioned on the upper portions of the deep trench capacitor 20. The trench top oxide 30 including silicon oxide may be formed by the high-density plasma chemical vapor deposition process.

The aforementioned SSBS process generally comprises the steps of etching back the sidewall oxide dielectric layer and the polysilicon (or so-called Poly-2) to a first depth; refilling the recess with another layer of polysilicon (or so-called Poly-3); etching back the Poly-3 to a second depth; forming an asymmetric spacer on the Poly-3; and etching away the Poly-3 and Poly-2 that are not covered by the asymmetric spacer. Finally, the trench top oxide (TTO) 30 is filled into the deep trench capacitor 20 and then the trench top oxide (TTO) 30 is planarized by a CMP process.

The recessed-gate MOS transistor device 10 is connected to a diffusion region 24 expanded from the SSBS 26 through the drain region 14. The electrons or currents will flow from the bit line (not shown) to a bit line contact plug 40, the source region 13 of the recessed-gate MOS transistor device 10, and the U-shaped channel 16 which is turned on, then the electrons or currents continue flowing to the drain region 14, the diffusion region 24, and finally to the top electrode of the deep trench capacitor 20. In this way, the data storage can proceed.

In addition, the structures of the deep trench capacitors 20, 320 are the same. The deep trench capacitor 20 and the deep trench capacitor 320 belong to different DRAM cells. In the same way, the deep trench capacitor 320 also includes a doped polysilicon 322, a single-sided buried strap (SSBS) 326, a sidewall capacitor dielectric layer 323, a collar oxide layer 325 and a trench top oxide (TTO) 330.

The feature of the present invention is that the gate dielectric layer 15 has at least two different thicknesses. In other words, gate dielectric layer 15 has multi thicknesses. Therefore, the gate dielectric layer 15 has an asymmetric structure. The thicker part of the gate dielectric layer 15a is positioned between the recessed gate electrode 11 and the drain region 14. The thinner part of the gate dielectric layer 15b is positioned between the recessed gate electrode 11 and the source region 13. More particularly, the gate dielectric layer 15b is positioned both on the sidewall 12a adjacent to the source region 13 and the U-shaped bottom 12b.

According to a preferred embodiment of the present invention, the thickness of the gate dielectric layer 15a is between 150 angstroms and 300 angstroms. The thickness of the gate dielectric layer 15b is between 20 angstroms and 60 angstroms.

Figure 1:
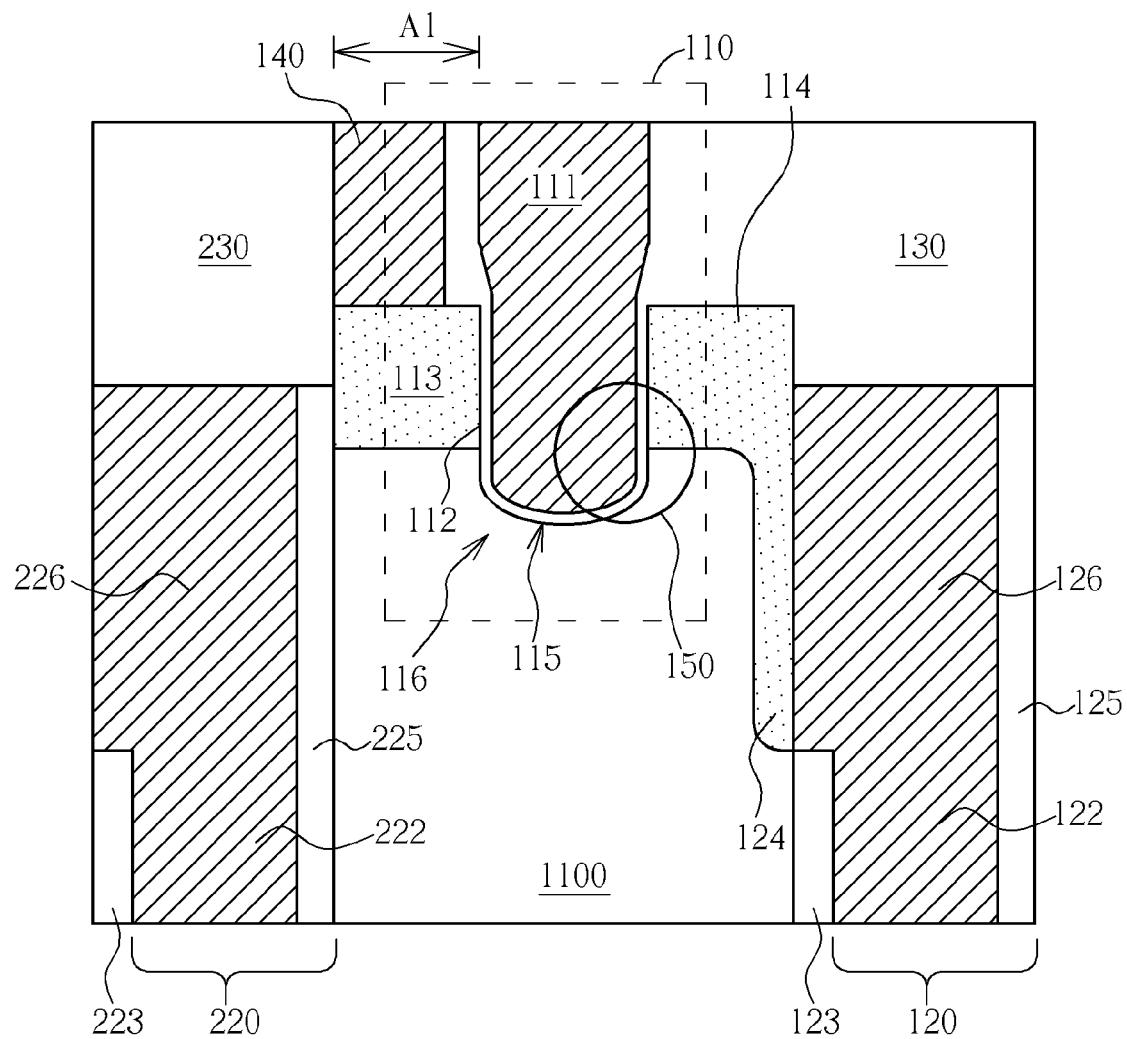
FIG. 1 shows the sectional view of a prior art DRAM.

The gate dielectric layer 15a can decrease the GIDL induced by the high electric field located at the interconnecting area (marked by a circle 50 in FIG. 1) of the recessed gate electrode 11, the drain region 14, and the semiconductor subtract 100 during operation. Due to the asymmetric structure of the gate dielectric layer 15, the operating performance of the recessed-gate MOS transistor device 10 can be improved.

Besides, because the gate dielectric layer 15a is thicker, the recessed-gate MOS transistor device 10 can be moved laterally toward the diffusion region 24. Therefore, the first width $W_1$ of the drain region 13 in the lateral direction will be smaller than the second width $W_2$ of the source region. Compared to the prior art DRAM cell shown in FIG. 1, the source region 13 of the present invention DRAM cell occupied relatively larger surface area. Therefore, the landing area $A_2$ in the lateral direction is increased, which facilitates the fabrication of the bit line contact plug 40.

Figure 3:
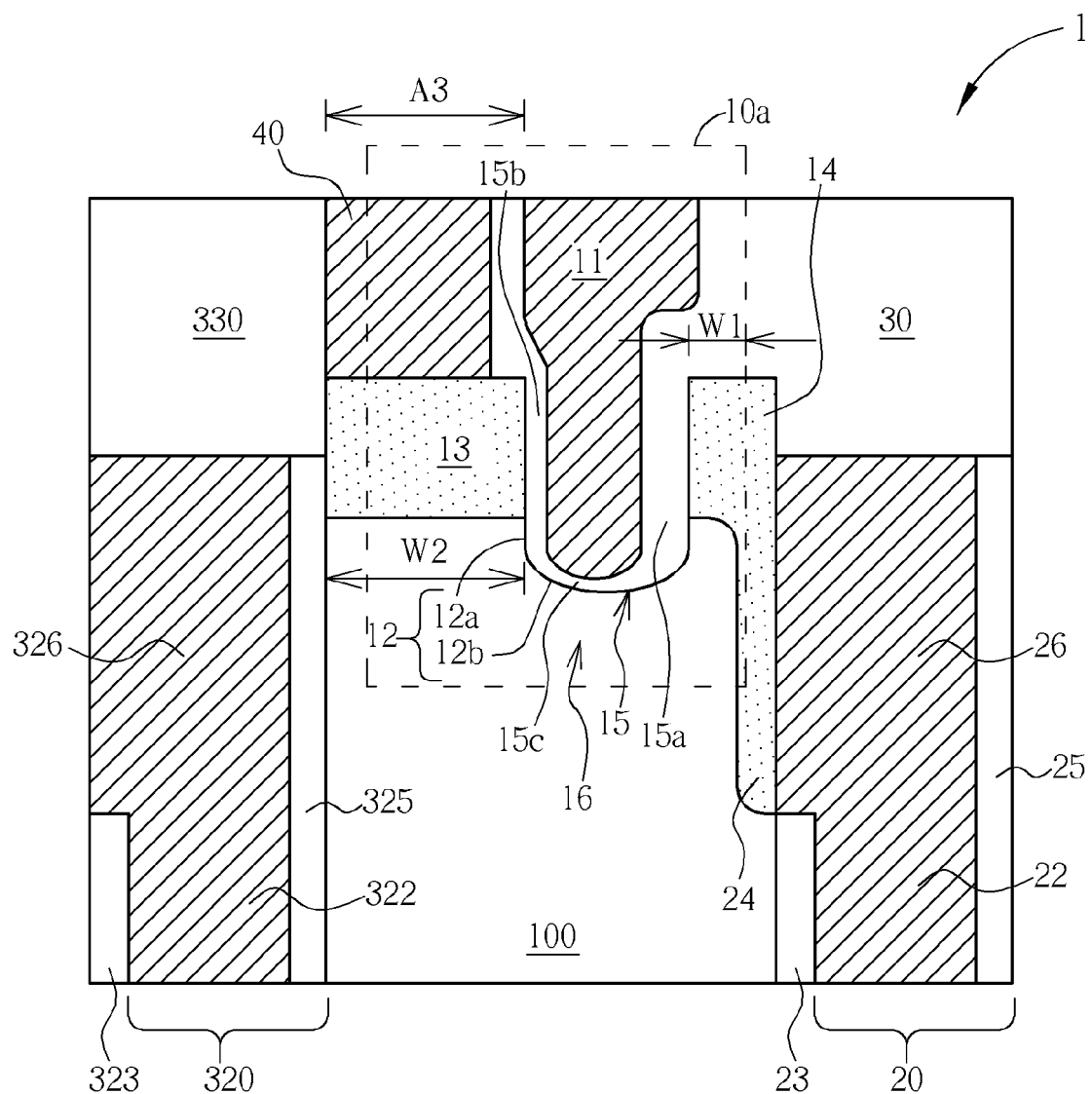
FIG. 3 is a schematic sectional view showing the recessed-gate MOS transistor device according to another preferred embodiment of this invention.

FIG. 3 is a schematic sectional view showing the recessed-gate MOS transistor device according to another preferred embodiment of this invention. The same labels will be utilized again in FIG. 3. As shown in FIG. 3, a recessed-gate MOS transistor device 10a includes a recessed gate electrode 11, a source region 13 having a second width $W_2$, a drain region 14 having a first width $W_1$, and a gate dielectric layer 15.

The recessed gate electrode 11 is embedded in a gate trench 12 formed in a semiconductor substrate 100 with a predetermined depth. The gate trench 12 includes a sidewall 12a and a U-shaped bottom 12b. The U-shaped channel 16 of the recessed-gate MOS transistor device 10 is located at the U-shaped bottom 12b.

The deep trench capacitor 20 comprises a doped polysilicon 22, a sidewall capacitor dielectric layer 23, a collar oxide layer 25, a SSBS and a trench top oxide (TTO) 30. The doped polysilicon 22 functions as a top electrode of the deep trench capacitor 20. For the sake of simplicity, only the upper portions of the deep trench capacitor 20 are shown in the figures. It is understood that the deep trench capacitor 20 further comprises a buried plate acting as the bottom capacitor electrode, which is not shown. The recessed-gate MOS transistor device 10a together with the deep trench capacitor structure 20 form a DRAM cell. Besides, a deep trench capacitor 320 disposed adjacent to the recessed-gate MOS transistor device 10a belong to another DRAM cell. The deep trench capacitor 320 includes a doped polysilicon 322, a single-sided buried strap (SSBS) 326, a sidewall capacitor dielectric layer 323, a collar oxide layer 325 and a trench top oxide (TTO) 330.

The gate dielectric layer 15 has three different thicknesses. In other words, the gate dielectric layer 15 has multi thicknesses. Therefore, the gate dielectric layer 15 has an asymmetric structure. The thickest part of the gate dielectric layer 15a is positioned between the recessed gate electrode 11 and the drain region 14. The thicker part of the gate dielectric layer 15b is positioned between the recessed gate electrode 11 and the source region 13. The thick part of the gate dielectric layer 15c is positioned at the U-shaped bottom 12b.

Because the gate dielectric layer 15a is thicker, the recessed-gate MOS transistor device 10 can be moved laterally toward the diffusion region 24. Therefore, the first width $W_1$ of the drain region 13 in the lateral direction will be smaller than the second width $W_2$ of the source region. In other words, the landing area $A_3$ in the lateral direction is increased to create a larger area for fabricating the bit line contact plug 40.

According to a preferred embodiment of the present invention, the thickness of the gate dielectric layer 15a is between 150 angstroms and 300 angstroms. The thickness of the gate dielectric layer 15b is between 80 angstroms and 120 angstroms. The thickness of the gate dielectric layer 15c is between 20 angstroms and 60 angstroms.

In addition, the asymmetric gate dielectric layer with multi thicknesses is not only suitable for the recessed-gate MOS transistor device, but also suitable for other variations of the extended U-shape devices.

Figure 4:
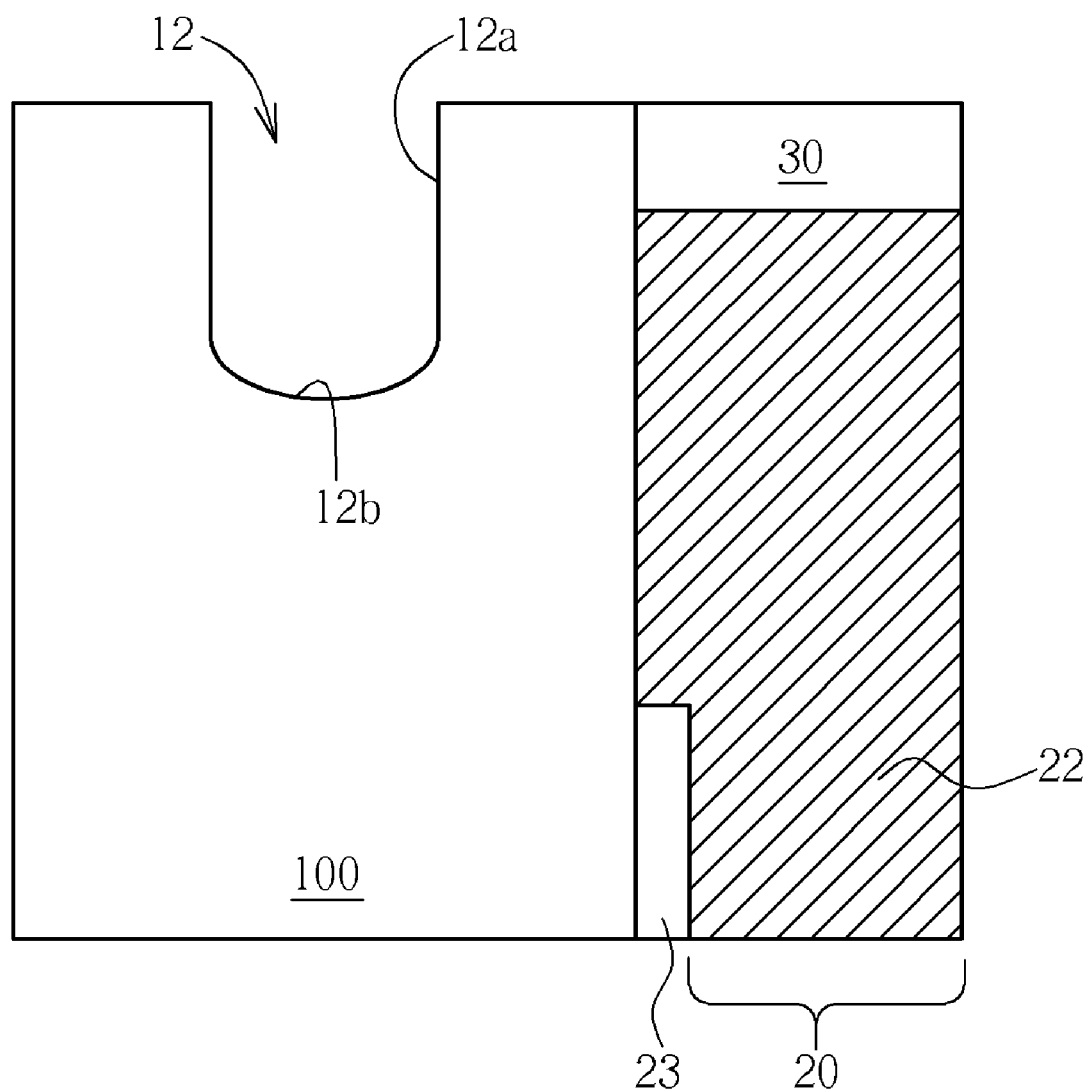
FIG. 4 to FIG. 7 are schematic, cross-sectional diagrams illustrating a method of fabricating a gate dielectric layer having three different thicknesses.

FIG. 4 to FIG. 7 are schematic, cross-sectional diagrams illustrating a method of fabricating a gate dielectric layer having three different thicknesses. The same labels will be utilized through FIG. 4 to FIG. 7. As shown in FIG. 4, a deep trench capacitor structure 20 is formed on a semiconductor substrate 100 comprising a doped polysilicon 22 and a sidewall capacitor dielectric layer 23. Next, a gate trench 12 includes a sidewall 12a and a U-shaped bottom 12b is formed on the semiconductor substrate 100.

Figure 5:
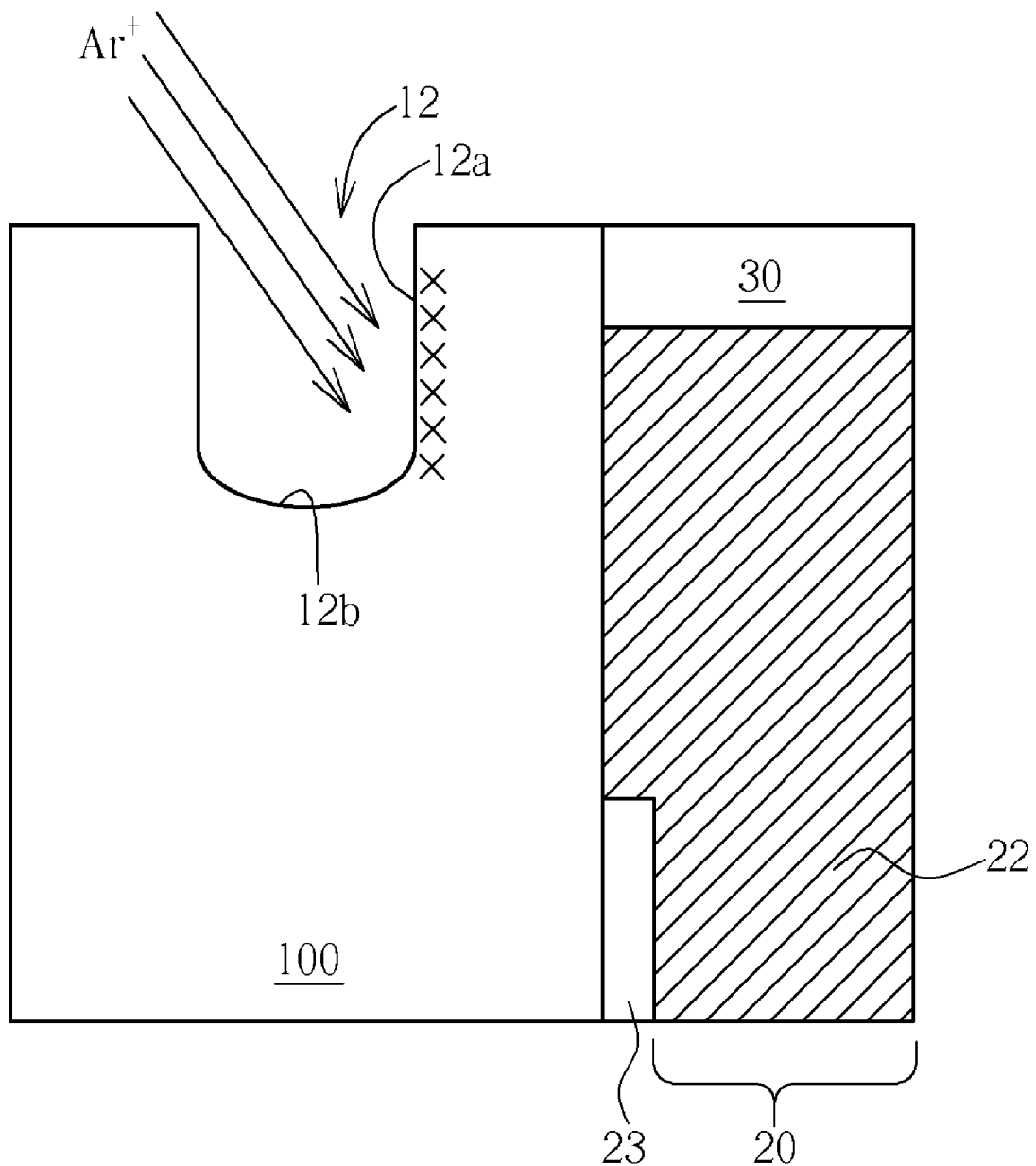
Figure 6:
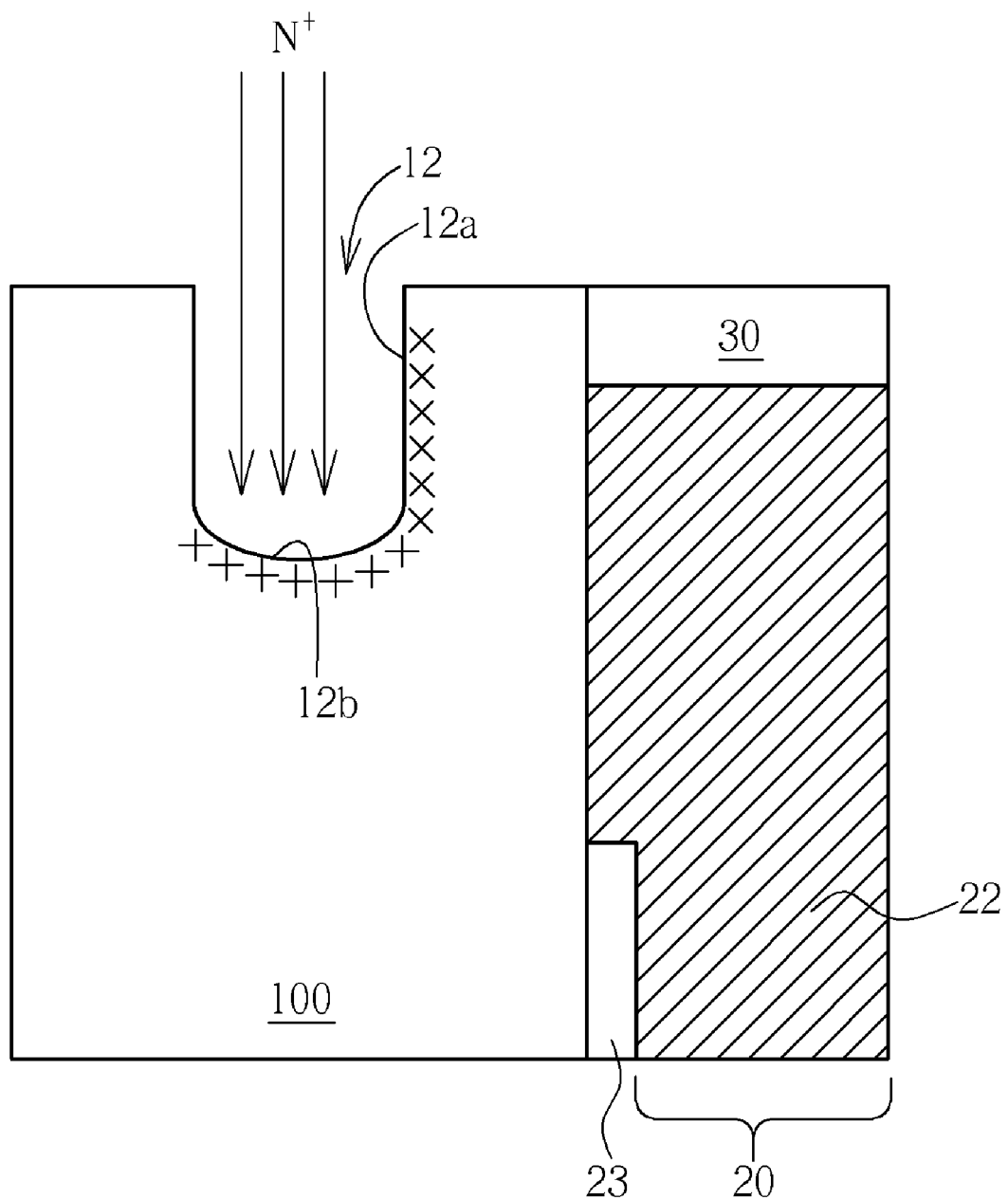

As shown in FIG. 5, argon ions with predetermined concentration are implanted into the sidewall 12a adjacent to the deep trench capacitor structure 20 by a tilt angle implant process. Next, as shown in FIG. 6, an ion implant process is performed to implant hydrogen ions with a predetermined concentration into the U-shaped bottom 12b. The sequence of the implant process described in FIG. 5 and FIG. 6 can be changed.

Figure 7:
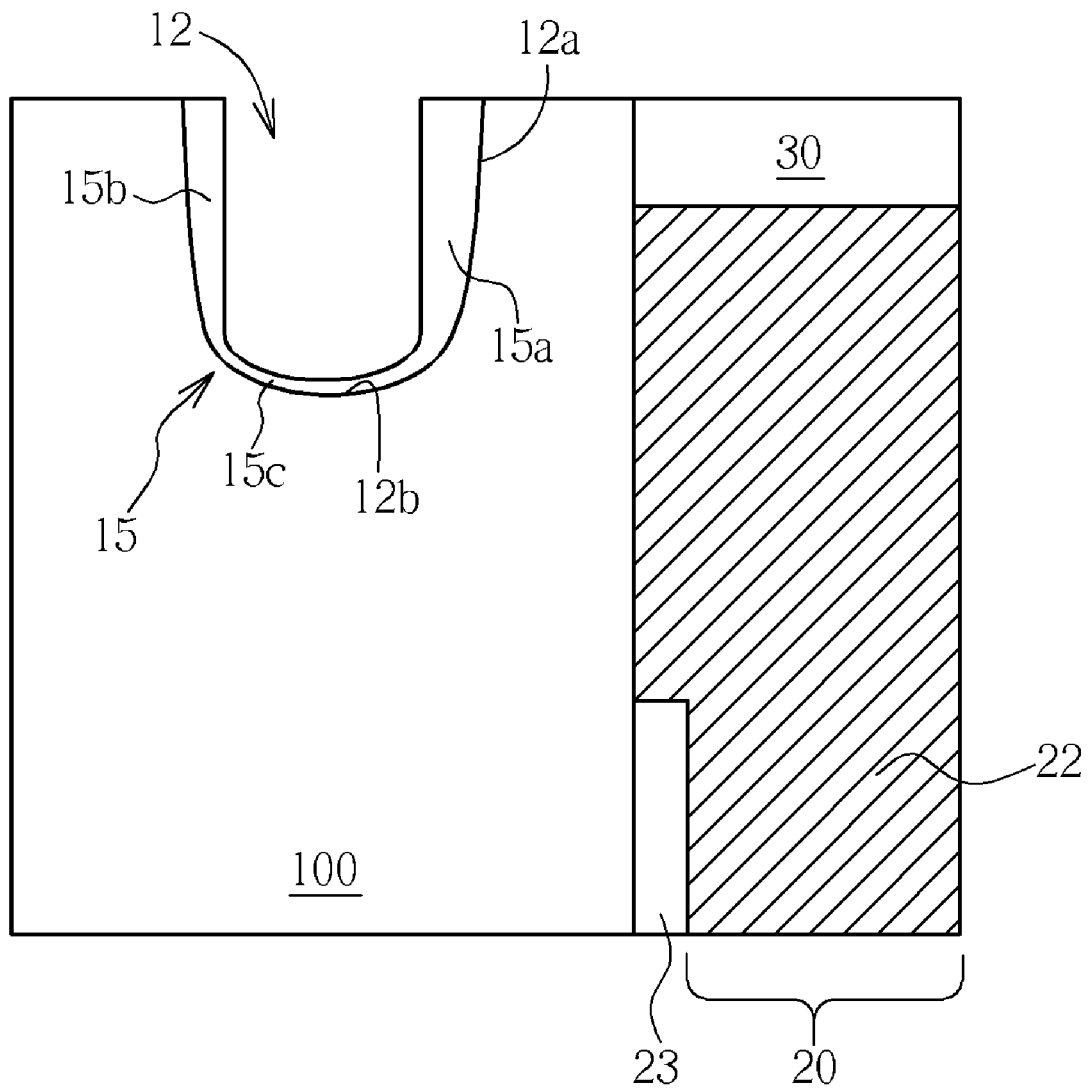

As shown in FIG. 7, a thermal oxidation process is performed to form a gate dielectric layer 15 with an asymmetric structure on an inner surface of the gate trench 12. The thermal oxidation process preferably is a furnace treatment or a rapid thermal process (RTP). The oxide layer on the sidewall 12a with argon ions grows fastest, and the oxide layer on the sidewall 12b with hydrogen ions grows slowest during the thermal oxidation process. As a result, the gate dielectric layer 15 has an asymmetric structure with three different thicknesses.

The ISSG process is not a suitable thermal oxidation process for fabricating a gate dielectric layer having three different thicknesses as illustrated in FIG. 4 to FIG. 7. The ISSG process does not have selectivity for the semiconductor substrate with dopants, therefore, the oxidation rate is the same no matter whether the semiconductor substrate has dopants or not.

In addition, by using the same idea that the ion implant can lead to selectivity in oxide layer growth, the asymmetric gate dielectric layer 15 can be formed by implanting nitrogen ions with different concentrations. For example, a higher concentration of nitrogen ions is implanted vertically into the U-shaped bottom 12b. Afterwards, a lower concentration of nitrogen ions is implanted into the sidewall 12a by a tilt angle implant process.

Next, a thermal oxidation process is performed. The oxide layer on the sidewall 12a with the higher concentration of nitrogen ions grows slowest, so the oxide layer on the sidewall 12a is the thinnest. The oxide layer on the sidewall 12b with the lower concentration of nitrogen ions grows slower, and the oxide layer on the gate trench 12 not implanted by nitrogen ions grows fastest. In this way, the gate dielectric layer 15 having an asymmetric structure with three different thicknesses can be formed.

FIG. 8 to FIG. 11 are schematic, cross-sectional diagrams illustrating a method of fabricating a gate dielectric layer having three different thicknesses by the ISSG process.

Figure 8:
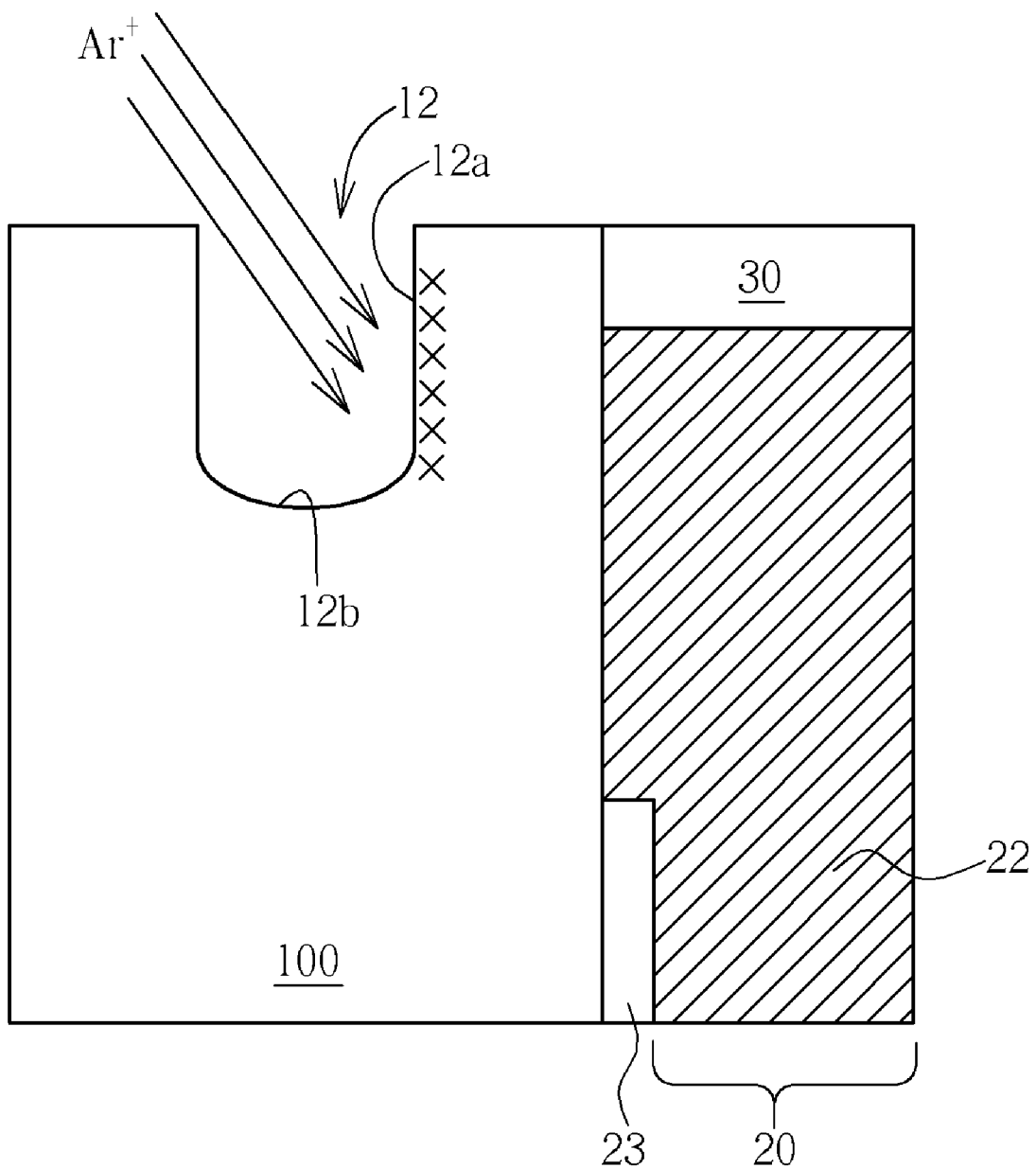
FIG. 8 to FIG. 11 are schematic, cross-sectional diagrams illustrating a method of fabricating a gate dielectric layer having three different thicknesses by an ISSG process.

As shown in FIG. 8, a deep trench capacitor structure 20 is formed on a semiconductor substrate 100 comprising a doped polysilicon 22 and a sidewall capacitor dielectric layer 23. Next, a gate trench 12 including a sidewall 12a and a U-shaped bottom 12b is formed on the semiconductor substrate 100. Next, argon ions with predetermined concentration are implanted into the sidewall 12a adjacent to the deep trench capacitor structure 20 by a tilt angle implant process.

Figure 9:
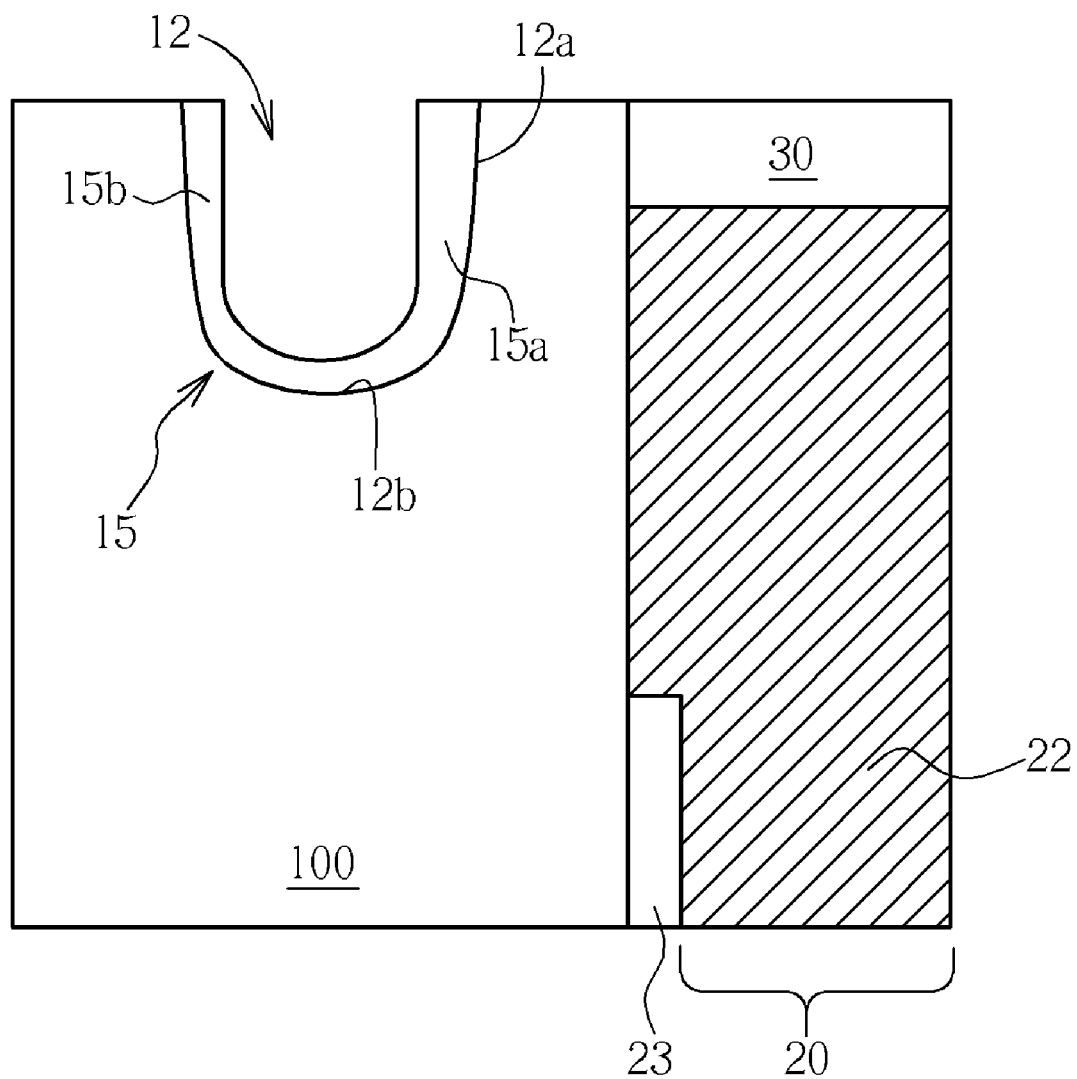

As shown in FIG. 9, a first thermal oxidation process, such as a furnace treatment or a rapid thermal process (RTP) is performed. As a result, a gate dielectric layer 15a and a gate dielectric layer 15b having different thicknesses are formed in the gate trench 12. The oxide layer on the sidewall 12a adjacent to the deep trench capacitor structure 20 grows faster, so the oxide layer on the sidewall 12a adjacent to the deep trench capacitor structure 20 is the thickest. The oxide layer on the U-shaped bottom 12b and the sidewall 12a not implanted by the argon ions grows slower. In this way, the gate dielectric layer 15a and the gate dielectric layer 15b having different thicknesses can be formed. As a result, the gate dielectric layer 15 forms an asymmetric structure.

Figure 10:
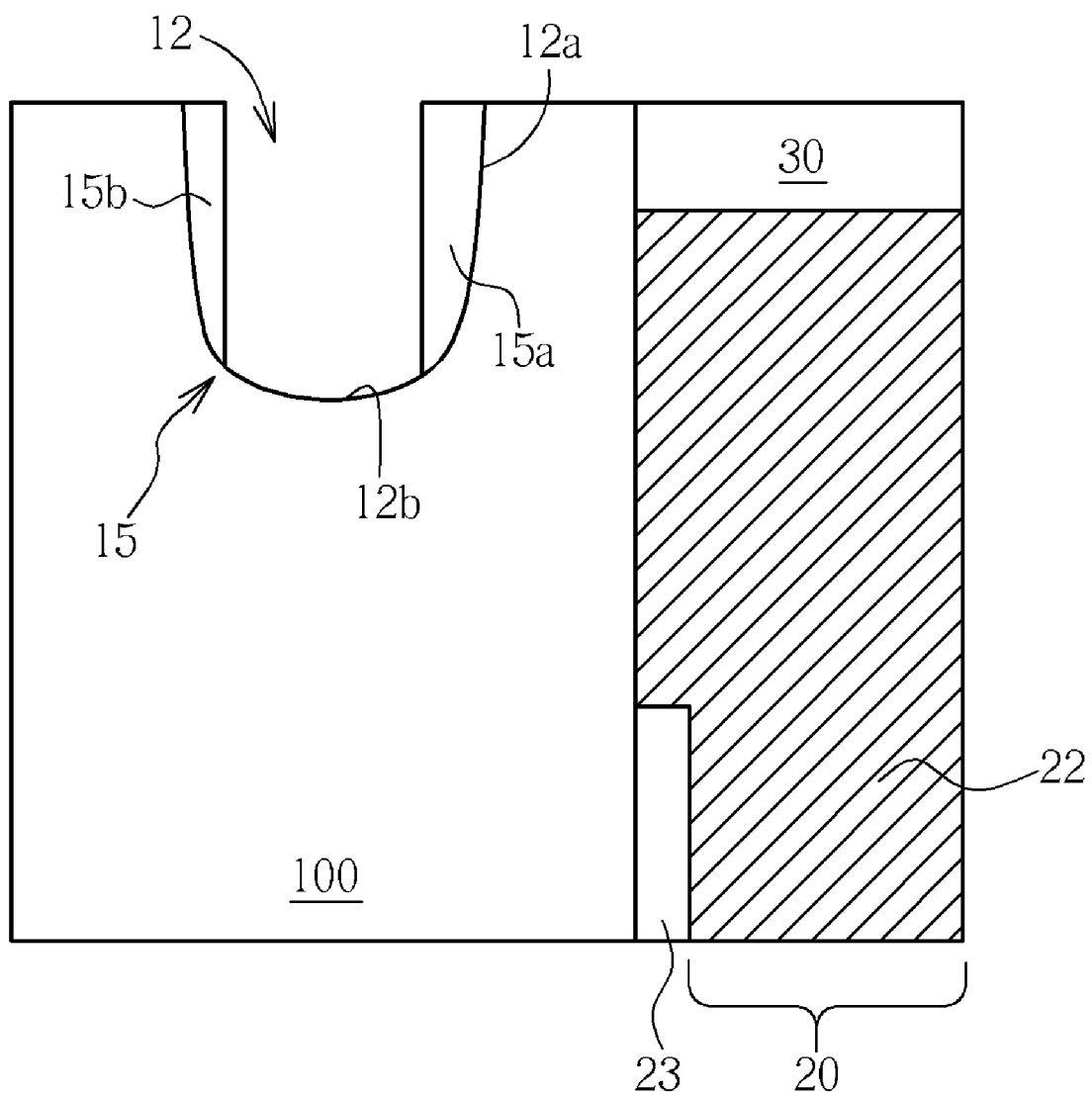
Figure 11:
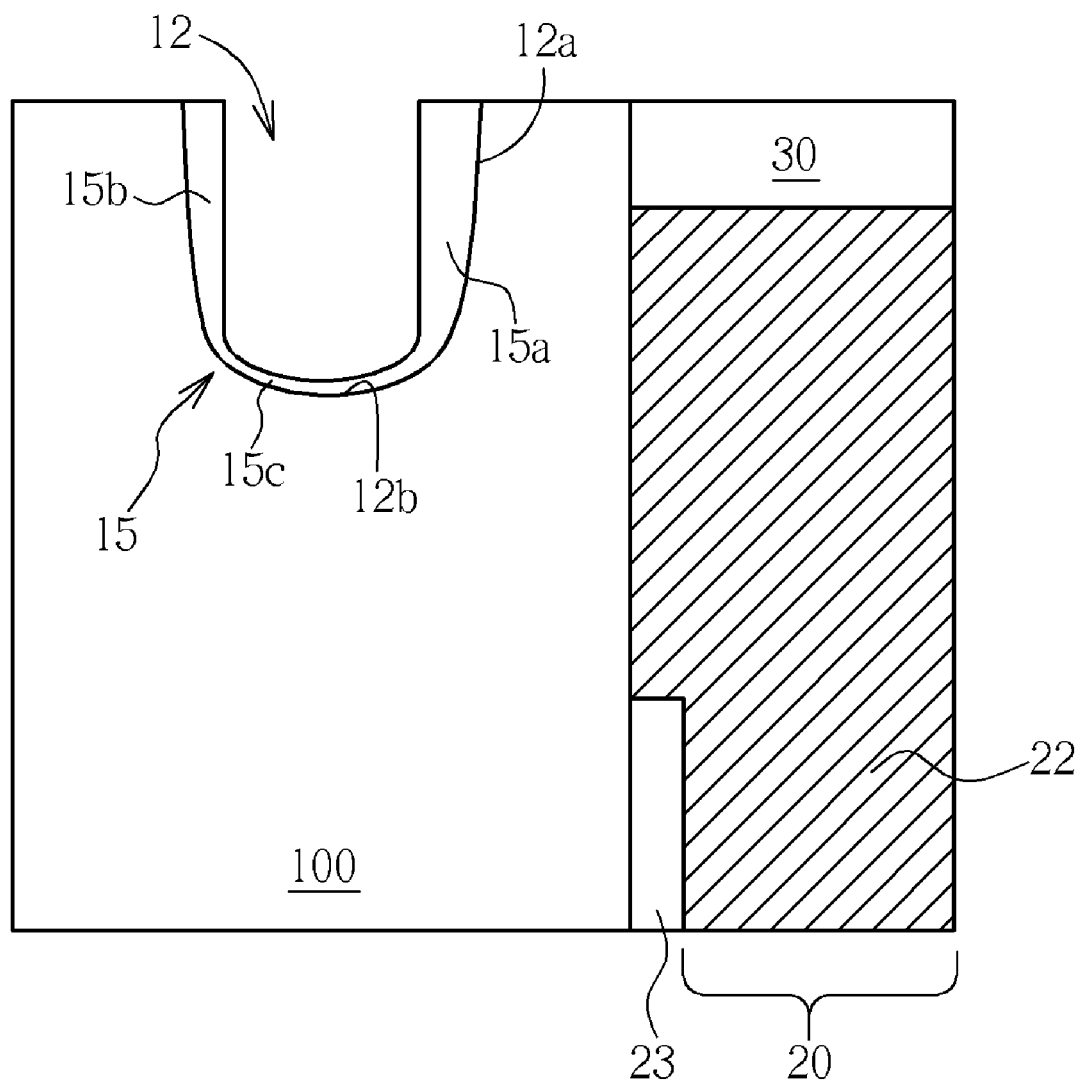

As shown in FIG. 10, an anisotropic etching is performed to remove the gate dielectric layer 15b positioned on the U-shaped bottom 12b, then a part of the semiconductor substrate 100 is exposed. As shown in FIG. 11, a second thermal oxidation process such as the ISSG process is performed to grow a gate dielectric layer 15c on the exposed semiconductor substrate 100 in the gate trench 12. In this way, the gate dielectric layer 15 with three different thicknesses in the gate trench 12 can be reached by only performing the ion implant process once.

Those skilled in the art will readily observe that numerous modifications and alterations of the device and method may be made while retaining the teachings of the invention.

What is claimed is:

1. A transistor device comprising:
  a substrate having a gate, wherein the gate has a buried portion embedded in the substrate and a dielectric layer formed on an inner surface of the buried portion of the gate, the dielectric layer provided with multi thicknesses, wherein the dielectric layer is an asymmetric structure, the thickness of the dielectric layer at a corner of the gate is non-uniform, and the gate has a U-shaped bottom; and
  a source region and a drain region, formed in the substrate and positioned in two opposite sides of the buried portion of the gate respectively, wherein the dielectric layer disposed between the gate and the drain region is thicker than all of the dielectric layer disposed at the U-shaped bottom of the gate.

2. The transistor device according to claim 1, wherein the dielectric layer has a first thickness adjacent to the drain region and a second thickness adjacent to the source region.

3. The transistor device according to claim 2, wherein the first thickness is thicker than the second thickness.

4. The transistor device according to claim 2, wherein the dielectric layer formed in bottom of the buried portion of the gate has a third thickness.

5. The transistor device according to claim 4, wherein the second thickness is thicker than the third thickness.

6. The transistor device according to claim 4, wherein the third thickness is thinner than the first thickness.

7. The transistor device according to claim 6, wherein the second thickness is thicker than the third thickness.

8. A memory device comprising:
   a first deep trench capacitor and a second deep trench capacitor formed in a substrate;
   a gate partially embedded in the substrate and between the two deep trench capacitors, wherein the gate has a dielectric layer with a multi thicknesses formed in a bottom portion of the gate, the dielectric layer is an asymmetric structure, the thickness of the dielectric layer at the corner of the gate is non-uniform, and the gate has a U-shaped bottom; and
   a source region formed in the substrate and between the first deep trench capacitor and the gate, and the source region contacting a bit line contact plug; and
   a drain region formed in the substrate adjacent to a diffusion region near the second deep trench capacitor, wherein the drain region has a first width and the source region has a second width, the second width is longer than the first width, the first width is uniform, and the dielectric layer disposed between the gate and the drain region is thicker than all of the dielectric layer disposed at the U-shaped bottom of the gate.

9. The memory device according to claim 8, wherein the dielectric layer formed on a side adjacent to the drain region has a first thickness, and a side adjacent to the source region has a second thickness thinner than the first thickness.

10. The transistor device according to claim 1, wherein the dielectric layer adjacent to the drain region and the dielectric layer adjacent to source region are asymmetric.

\* \* \* \* \*